United States Patent [19]
Fujihira

[11] Patent Number: 5,332,722
[45] Date of Patent: Jul. 26, 1994

[54] NONVOLATILE MEMORY ELEMENT COMPOSED OF COMBINED SUPERCONDUCTOR RING AND MOSFET

[75] Inventor: Mitsuka Fujihira, Yokohama, Japan

[73] Assignee: Sumitomo Electric Industries, LTD, Osaka, Japan

[21] Appl. No.: 28,632

[22] Filed: Mar. 8, 1993

Related U.S. Application Data

[63] Continuation of Ser. No. 921,409, Jul. 31, 1992, abandoned, which is a continuation of Ser. No. 660,989, Feb. 27, 1991, abandoned, which is a continuation of Ser. No. 279,115, Dec. 2, 1988, abandoned.

[30] Foreign Application Priority Data

Dec. 2, 1987 [JP] Japan .................. 62-304940

[51] Int. Cl.$^5$ .............. G11C 11/44; G11C 11/063; H01L 27/18
[52] U.S. Cl. .................. 505/170; 505/831; 505/833; 505/841; 505/191; 365/160; 365/161; 257/421; 257/427
[58] Field of Search .......... 365/160, 161, 162; 505/1, 831, 832, 833, 834, 836, 841; 257/31, 33, 421, 427

[56] References Cited

U.S. PATENT DOCUMENTS

| | | | |
|---|---|---|---|
| 3,705,393 | 12/1972 | Anacker et al. | 365/162 |
| 3,763,407 | 10/1973 | Yazawa | 257/421 X |
| 3,879,715 | 4/1975 | Zappe | 505/832 |
| 4,831,427 | 5/1989 | Coleman, Jr. | 357/27 |
| 5,011,817 | 4/1991 | Hidaka et al. | 365/130 |
| 5,039,656 | 8/1991 | Hidaka et al. | 365/160 X |
| 5,041,880 | 8/1991 | Nojima et al. | 365/160 X |
| 5,051,737 | 9/1991 | Hasegawa | 365/160 X |

OTHER PUBLICATIONS

Terlep, "Nonvolatile, NDRO, Array Logic Memory Cell in Josephson Technology," IBM Tech. Disc. Bull vol. 17, No. 3, Aug 1974, pp. 890–891.

"Low-Temperature Characterization of Buried Channel NMOST" by Wilcox et al., IEEE Transactions on Electron Devices, vol. 36, No. 8, Aug. 1989, pp. 1440–1441.

Ellis, "Superconductors," Journal of Chemical Education, vol. 64, No. 10, Oct. '87, pp. 836–841.

Primary Examiner—Joseph L. Dixon
Assistant Examiner—Michael A. Whitefield
Attorney, Agent, or Firm—Kerkam, Stowell, Kondracki & Clarke

[57] ABSTRACT

A novel nonvolatile memory element or cell comprising a memory means consisting of at least one superconducting ring (21, 22) and a detector means consisting of a MOSFET. The superconducting ring and the MOSFET are arranged in such a manner that a magnetic flux created by the superconducting ring (21, 22) passes through a channel zone of the MOSFET. Information is held in the superconducting ring in a form of permanent current and is detected electrically as variation in the conductivity of the channel zone of the MOSFET.

14 Claims, 3 Drawing Sheets 5,332,722

NONVOLATILE MEMORY ELEMENT COMPOSED OF COMBINED SUPERCONDUCTOR RING AND MOSFET

This is a continuation of application Ser. No. 07/921,409, filed Jul. 31, 1992 now abandoned which in turn is a continuation of U.S. Ser. No. 660,989 filed Feb. 27, 1991 now abandoned which is a continuation of U.S. Ser. No. 279,115 filed Dec. 2, 1988 now abandoned.

BACKGROUND OF THE INVENTION

1. Field of the Invention

The present invention relates to a new type nonvolatile memory element or cell including a superconductor ring. More precisely, it relates to a new concept of the nonvolatile memory element or cell comprising a superconductor ring and a MOSFET.

In a preferred embodiment, the nonvolatile memory according to the present invention includes a superconductor ring composed of compound oxide or metal oxide complex possessing a high critical temperature of superconductivity.

2. Description of the Related Art

The nonvolatile memory for computers or information processing systems can held information even after a power supply is turned off.

The conventional memory element or cell for the nonvolatile memories is constructed by a semiconductor element which can store electrostatic charge such as MNOS (metal-nitride-oxide-semiconductor) or MAOS (metal-alumina-oxide-semiconductor) or by a semiconductor element which utilizes avalanche or tunnel effect such as FAMOS (floating-gate avalanche-injection MOS) or MNOS (metal-nitride-oxide semiconductor). These semiconductor memories are used widely as PROM in computers.

In the above-mentioned conventional semiconductor memories, information is stored basically in a form of charge. Therefore, if the charge is neutralized or lost, the information is also lost. Still more, the trapped electrons disappear under strong irradiation of X-ray or UV ray. In other words, irradiation of X-ray or UV ray can be used for erasing FAMOS. However, FAMOS can not be erased by electrical mode. In the case of MNOS and MAOS, holding time of information is limited.

Now, the present inventors propose a new concept of the nonvolatile memory element or cell which can hold or store information in a form of permanent current in a superconductor ring.

Therefore, an object of the present invention is to provide a novel memory element or cell including at least one superconductor ring.

Summary of the Invention

The present invention provides a novel nonvolatile memory element or cell comprising a current storing means including superconductor ring or rings and a detector means including a MOSFET positioned in the magnetic field which is produced by a permanent current of the superconductor ring or rings.

The MOSFET used in the present invention can be a well-known N channel type transistor constructed monolithically on a silicon substrate and provided with a source, a drain and a gate. The MOSFET is not limited to the N channel type but can be any one type of the conventional structures.

According to the present invention, at least one superconducting ring is placed or positioned in the neighborhood of the the MOSFET in such a manner that the magnetic flux created by the superconducting ring pass through a channel zone of the MOSFET.

In the simplest mode of realization of the present invention, the superconducting ring can be positioned above the MOSFET through an air gap in such a manner that the center of the superconducting ring is aligned with the channel zone of the MOSFET. In a preferred mode of realization, the current storing means including superconductor ring is connected mechanically to the detector means through an insulator. It is also preferable that the diameter of the superconducting ring is as small as possible in order to increase the degree of integration or to decrease the size of the memory element or cell. However, a superconducting ring whose diameter is larger than the dimension of the channel zone of the MOSFET may be used provided that the magnetic flux created by the ring pass through the channel zone.

In a preferred embodiment, two superconducting rings comprising a lower ring and an upper ring are stuck one over another in such a manner that the lower superconducting ring is supported on an insulator deposited on the MOSFET, while the upper superconductor ring is placed just over the lower superconducting ring through another insulator.

As mentioned above, the memory element or cell according to the present invention can consist of only one superconducting ring and one MOSFET. In this case, when a permanent current is supplied to and reserved in the sole superconducting ring, a magnetic flux created by the permanent current passes through a N channel zone of the MOSFET ( this condition is called a state "1" hereinafter). To the contrary, if the permanent current is removed out of the superconducting ring, it is realized another condition under which no magnetic flux passes through the channel zone (this condition is called a state "0" hereinafter).

The electrical conductivity between a source and a drain of the MOSFET depends on the magnetic condition imposed on the N channel according to Landau level. In other words, the conductivity ($\sigma$) change in function of the flux density (B) of the magnetic field created by the superconducting ring and of the gate voltage (Vg), so that when the flux density (B) of the magnetic field and the gate voltage (Vg) are determined, the value of the conductivity ($\sigma$) between the source and the drain is also determined. Therefore, two states of "1" and "0" realized by the superconducting ring can be detected by the detector means consisting of the MOSFET as a function of the difference in the conductivity between a value ($\sigma_1$) which is observed when the magnetic field is created and a value ($\sigma_0$) which is observed when the magnetic field is removed. The value ($\sigma_0$) is determined by the conventional $\sigma\_Vg$ curve for usual semiconductors. The above-mentioned two states are sensed or detected by the MOSFET. Thus, the memory element or cell according to the present invention can be used as a binary memory which functions according to existence or absence of the permanent current on the superconducting ring.

In a preferred embodiment, two superconducting rings are stuck one over another through an insulator. When more than two superconductor rings are stuck one over another, more than two states such as "0", "1" and "2" can be held in the memory element or cell and are detected by one MOSFET. An example of this preferred embodiment will be described hereinafter.

The memory element or cell according to the present invention can be assembled into a memory matrix or array by arranging a plurality of the memory element or cells according to the present invention two-dimensionally by the conventional technique used in the industry of semiconductor memories.

DESCRIPTION OF THE PREFERRED EMBODIMENT

Figure 1:
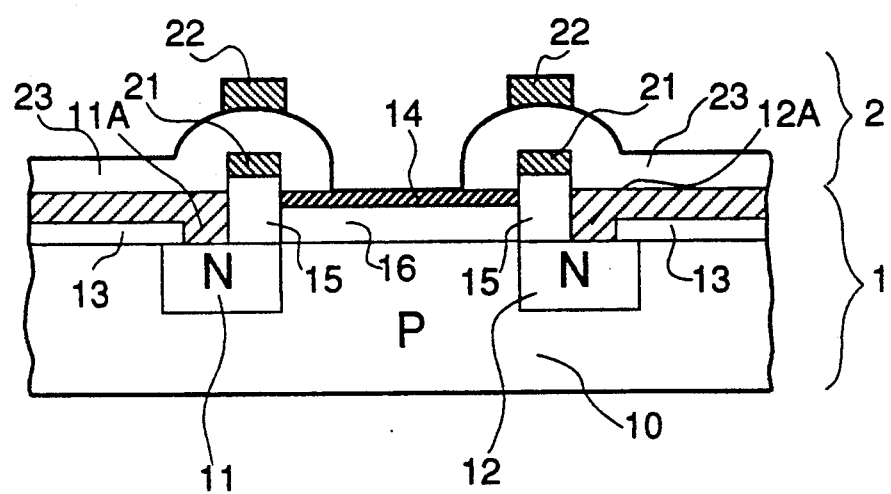
FIG. 1 is an illustrative cross sectional view of a nonvolatile memory element or cell which is an embodiment of the concept of the present invention.

Now, the principle of the write-read out functions of the present memory element or cell will be described in more details.

Writing and Erasing of Information;

In the memory element or cell according to the present invention, information is stored in a form of permanent current on the superconducting ring or rings. In order to write information into the memory element or cell, electric current is supplied to selected one of the superconducting rings. The current can be applied to the superconducting ring by any one of the following known techniques.

In a mechanical current supply mode, the superconducting ring is made contact with a power source. For example, a pair of lead wires connected to the power source are contacted mechanically with the superconducting ring at two points, preferably diametrically opposite sides thereof at a temperature where the superconductivity is realized, and then the contact with the power source is cut so that the permanent current is reserved in the ring even after the connection with the power source is cut under the superconducting condition.

The current supply can be effected by electrical mode. For example, a planar superconducting loop can be used. In this case, the current supply is controlled at a switching gate which is included as a part of the memory element and which is actuated electrically. In the superconducting switching technique, the write gate has two control lines comprising X-line which runs horizontally and Y'-line which runs vertically over the cell and supplied by a corresponding Y-line. To write an information, the switching gate is momentaily switched by supplying triple coincident pulses of $I_{Y'}$, $I_X$ and $I_{Y'}$. To erase the information, $I_X$ and $I_{Y'}$, are supplied conincidentally. Such switching gate is described by W. H. Henkels et al. in "IEEE Journal of Solid-state Circuits" Vol. SC-14, No. 5, October 1979.

The Switching can be also effected thermally or magnetically. In this case, the switching gate is placed selectively either under the superconducting condition or under the ordinary conducting condition thermally or magnetically.

When the permanent current is created by the magnetic mode, a magnetic field generator which can create a strong magnetic field passing through the center of the superconducting ring is positioned in the neighborhood of the ring, so that an induced magnetic field passing through the rings is created. This induced magnetic field generate an induced currents or the permanent current in the ring.

In a case that a plurality of the memory elements according to the present invention are arranged in a form of a memory matrix or array, suitable numbers of lead lines are integrated with the superconducting rings.

Erasing of information or removal of the permanent current from the superconducting rings can be realized by any one of thermal mode, magnetic mode and current mode. In the cases of the thermal mode and the current mode, the permanent current can be removed independently out of each of the superconducting rings by applying a predetermined amount of heat or current which exceed the critical temperature or the critical current density of superconductivity to a selected superconducting ring through the lead lines or at the superconducting switching gate. In the case of magnetic mode, it may be difficult to remove the permanent current independently from a selected one or more than one superconducting rings, so that all permanent currents in all rings are removed simultaneously.

Read out of Information

Read out of the information held in the superconducting ring is detected by the detector means including the MOSFET positioned in the magnetic field which is produced by the permanent current of the superconductor ring or rings.

As mentioned above, when a semiconductor is placed in an intensive magnetic field, the conduction band and the valence band of the semiconductor are separated respectively into different levels having predetermined energy level, which are called Landau levels and the electrical conductivity between the source and the drain of the MOSFET depends on the flux density (B) of the magnetic field imposed on the N channel and the gate voltage (Vg).

The increment or decrement of the conductivity of MOSFET is detected electrically by any one of the conventional techniques which are well known in the art and hence are not described here.

How to Realize the Memory Element or Cell

In the simplest method for realizing the memory element or cell of the present invention, the current storing means and the detector means are prepared separately and then assembled in such a manner that the superconductor ring or rings is placed on a MOSFET and insulated therefrom by insulator. In this case, a small superconductor ring which is prepared separately by a known sintering technique is bonded on a surface of the MOSFET with an adhesive layer.

In a preferred embodiment, the superconductor ring is produced by physical vapour deposition technique. In this case, a thin film of superconducting material is deposited on a substrate by sputtering, ion plating, MBE (molecular beam epitaxy) or the like. The thin film is shaped into a ring form by using a mask during the deposition or by etching a predetermined portion of the film. Then, the substrate having the superconductor ring thereon is placed on a MOSFET in such manner that a center of the ring is aligned with a channel portion of the MOSFET and the relative position between them are fixed mechanically. In a variation, the thin film of the superconducting ring may be produced directly on the MOSFET by the physical vapour deposition technique.

It is not necessary to describe the structure and the method for manufacturing the MOSFET which is well-known and hence we will describe those of the superconductor ring hereafter.

The superconducting ring or rings can be made of superconducting metal or metal alloy such as Nb-Ti, $Nb_3Sn$, $Nb_3(Al,Ge)$, $Nb_3Ge$, $PbMo_6S_8$ or the like. Preferably, the ring is composed of a new type compound oxide or a metal oxide complex having a high critical temperature of superconductivity.

This new type of superconducting material having a high Tc was revealed by Bednorz and Müller, who discovered a new oxide type superconductor in 1986 [Z. Phys. B64 (1986) 189]. The new type compound oxide superconductor discovered by Bednorz and Müller is represented by [La, Sr]$_2$CuO$_4$ which is called the $K_2NiF_4$-type oxide having a crystal structure which is similar to known perovskite type oxides. The $K_2NiF_4$-type compound oxides show such higher Tc as 30K, which are extremely higher than known superconducting materials. It was also reported that C. W. Chu et al. discovered, in the United States of America, another superconducting material so called YBCO type represented by $YBa_2Cu_3O_{7-x}$ having the critical temperature of about 90K in February 1987 (Physical Review Letters 58 (9) March 1987, pp 908-910). Still other type new superconducting materials which were reported recently are a compound oxide of Bi-Sr-Ca-Cu-O system and Tl-Ba-Ca-Cu-O system which exhibit such high Tc as more than 100K and which are chemically much stable than the abovementioned YBCO type compound oxide.

The compound oxide or a metal oxide complex is preferably represented by the general formula:

$$(\alpha_{1-x}\beta_x)Cu_yO_z$$

in which $\alpha$ is at least one element selected from a group comprising elements of IIa group of the Periodic Table and $\beta$ is at least one element selected from a group comprising elements of IIIa group of the Periodic Table, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively.

In a preferred system, the element $\alpha$ is Ba or Sr and the element $\beta$ is at least one element selected from a group comprising Y, La, Gd, Dy, Ho, Er, Tm, Yb, Nd, Sm, Eu and Lu and an atomic ratio of $\alpha:\beta$: Cu is 2:1:3 including the following compound oxides represented by the general formula:

$$Ln_1Ba_2Cu_3O_{7-\delta}$$

in which Ln stands for at least one element selected from a group comprising Y, La, Gd, Dy, Ho, Er, Tm, Yb, Nd, Sm, Eu and Lu and $\delta$ satisfies a range of $0<\delta<1$.

Thus, the preferable compound oxides are Ln-Ba-Cu-O system including the following special cases:

| | | |
|---|---|---|
| $Y_1Ba_2Cu_3O_{7-\delta}$, | $Ho_1Ba_2Cu_3O_{7-\delta}$, | $Lu_1Ba_2Cu_3O_{7-\delta}$, |
| $Sm_1Ba_2Cu_3O_{7-\delta}$, | $Nd_1Ba_2Cu_3O_{7-\delta}$, | $Gd_1Ba_2Cu_3O_{7-\delta}$, |
| $Eu_1Ba_2Cu_3O_{7-\delta}$, | $Er_1Ba_2Cu_3O_{7-\delta}$, | $Dy_1Ba_2Cu_3O_{7-\delta}$, |
| $Tm_1Ba_2Cu_3O_{7-\delta}$, | $Yb_1Ba_2Cu_3O_{7-\delta}$, | $La_1Ba_2Cu_3O_{7-\delta}$. | in which $\delta$ is a number which satisfies a range of $0<\delta<1$.

The above-mentioned compound oxides preferably possess perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

Another superconducting compound oxide which can be used by the present invention is represented by the general formula:

$$(M,Sr)_2CuO_{4-\delta}$$

in which M stands for Y or La and $\delta$ satisfies a range of $0<\delta<1$.

The superconducting ring or rings may be also composed essentially of a compound oxide represented by the formula:

$$\Theta_4(\Phi_{1-q},Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6<m<10$ and $4<n<8$ respectively, $p=(6+m+n)$, q is a number which satisfies a range of $0<q<1$, and r is a number which satisfies a range of $-2<r<+2$. This is considered to be a single phase of the following compound oxide or a mixed phase consisting mainly thereof:

| | |
|---|---|
| $Bi_4Sr_4Ca_4Cu_6O_{20-r}$, | $Bi_2Sr_2Ca_2Cu_3O_{10-r}$, |
| $Tl_4Ba_4Ca_4Cu_6O_{20-r}$, | $Tl_2Ba_2Ca_2Cu_3O_{10-r}$, | in which r is a number which satisfies a range of $-2<r<+2$.

Following is an example of preparation of a target used in sputtering for realizing a thin film of superconducting compound oxide of $YBa_2Cu_3O_7$ on the {001} plane of a substrate composed of $SrTiO_3$:

A powders Of $Y_2O_3$ and $BaCO_3$ are mixed in an atomic ratio of Y: Ba=1:2. Then, a powder of CuO is added to the resulting powder mixture in a proportion which is 10% excess with respect to an atomic ratio of Y:Ba:Cu=1:2:3. The resulting powder mixture is sintered at 950° C. to obtain a sintered block of $YBa_2Cu_3O_7$ which will be used as a target for a superconducting thin film.

The resulting target is set on a target holder and a substrate consisting of a single crystal of $SrTiO_3$ is secured on a substrate holder in a vacuum chamber in such a manner that the its surface on which the thin film is deposited has a {001} plane.

After the chamber is vacuumed, argon gas with a partial pressure of $5.0 \times 10^{-2}$ Torr and oxygen gas with a partial pressure of $1.0 \times 10^{-2}$ Torr are introduced and the substrate is heated at 670° C. Then, the magnetron electrode is energized with high frequency of 3 W/cm$^2$ to prepare a thin film of compound oxide of 1 μm on the substrate at a film-forming rate of 0.50 Å/sec.

After deposition of the thin film of compound oxide complete, the deposited thin film is left in an atmosphere of oxygen having a partial pressure of 1 atom for 15 hour with heating the substrate at 650° C. and then cooled slowly at a cooling rate of 7° C./min.

The resulting thin film deposited on the substrate is then assembled with a MOSFET as mentioned above.

Now, an embodiment of the memory element or cell which is realized by the concept of the present invention with referring to attached drawings.

Figure 3:
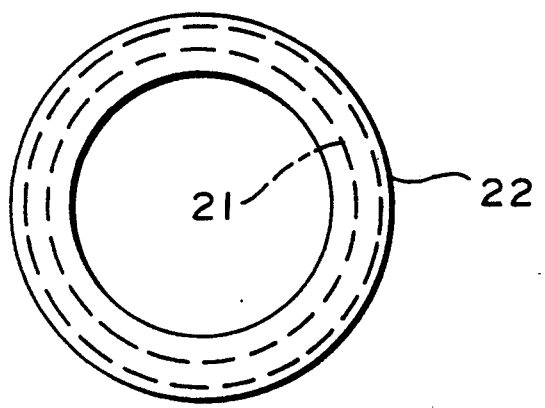

FIG. 3 is a simplified planar view showing the rings of the memory cell of FIG. 1.

In FIG. 1 which shows an illustrative cross sectional view of one nonvolatile memory element or cell which is an embodiment of the concept of the present invention, the memory element or cell comprises a detector means I consisting of a MOSFET and a memory means 2 including two rings 21 and 22, so that it is possible to apply two permanent currents to the lower ring 21 and the upper ring 22 independently. FIG. 3 shows a planar view of the upper ring 22 with the lower ring 21 appearing in phantom line.

The MOSFET shown in FIG. 1 is of a well-known N channel type which is constructed on a silicon substrate 10. The MOSFET includes two separate N-doped regions formed in the substrate 10 to form a source 11 and a drain 12 respectively and also to define a channel region between the source 11 and the drain 12. As shown, the gate electrode 14 is at least partially between an interior zone within ring 21 and the channel region or zone just below insulator 16. The interior zone is the zone disposed in the plane of ring 21 which is bounded at its periphery by the ring 21. In similar fashion, the gate electrode 14 is disposed between the interior zone within ring 22 and the channel zone. The gate electrode 14 is electrically isolated from the rings 21 and 22 as shown. A source electrode IIA and a drain electrode 12A are deposited on the source 11 and the drain 12 through an insulating layer 13, and a gate electrode 14 is formed on a gate insulator 16 formed on the channel region between the source II and the drain 12. The MOSFET itself has the conventional structure and hence is not explained here.

In the embodiment illustrated, two superconducting rings 21, 22 are stuck one over another above the N-doped region 11 and 12. A lower superconducting ring 21 is supported on an insulator deposited on the N-doped regions through a ring-shaped insulator 15 and an upper superconductor ring 22 is placed just over the lower superconducting ring 21 through another insulator 23.

Under the superconducting condition, a current in the first superconducting rings 21 is influenced by another current in the second superconducting ring 22, so that, in a case when two rings are used, a combined magnetic field is created by the permanent currents reserved in the superconducting rings 21 and 22.

As shown in FIG. 1, the two planes corresponding separately with rings 21 and 22 are parallel to the principal surface disposed at the top of the substrate 10. Since the magnetic flux from a loop, such as either or both of the rings 21 and 22, extend along the central axis of the loop in well known fashion, it will be readily appreciated that the flux from each of rings 21 and 22 passes through the channel zone 16 perpendicular to the principal surface at the top of substrate 10. As one of ordinary skill in the art will understand by what is shown in FIG. 1, there would be free flux passage between the rings 21 and 22 and the channel 16 since there is no magnetic shield therebetween.

Figure 2:
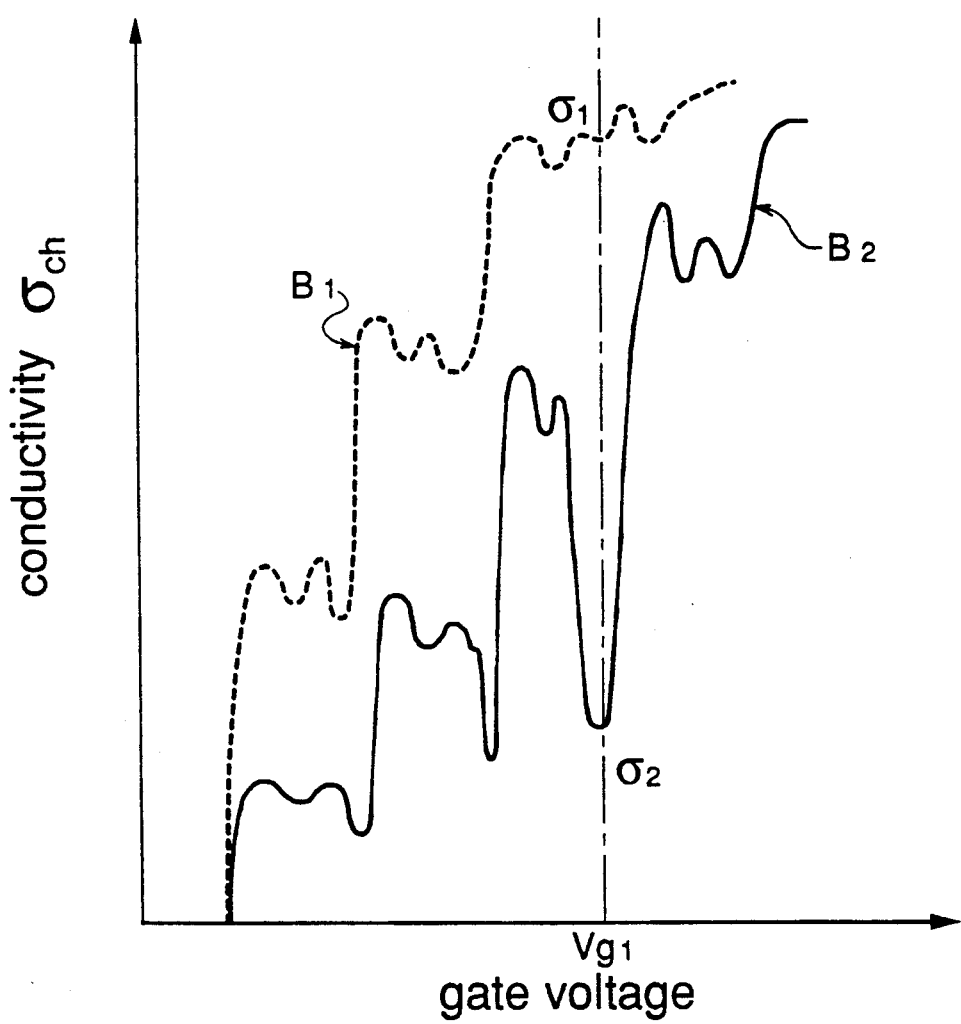
FIG. 2 is a graph which illustrates a dependency of the electrical conductivity ( ) between a source 11 and a drain 12 with respect to the gate voltage (Vg) of the memory element or cell shown in FIG. 1.

FIG. 2 shows a change of the electrical conductivity ($\sigma$) between the source 11 and the drain 12 in function of the gate voltage (Vg). It is apparent from FIG. 2 that when the combined magnetic field is applied to the N channel of the MOSFET, the value of the conductivity decrease from $\sigma_1$ (curve $B_1$) which is observed when the permanent current is reserved only in the lower ring 21 to $\sigma_2$ (curve $B_2$) under a selected value ($V_{g1}$) of gate voltage. In other words, the memory element or cell can holds two states in the function of the conductivity ($\sigma$) and hence of the condition whether the permanent current is reserved in the upper superconducting ring 22 or not.

As described above, the permanent current can be applied to each of the superconducting rings 21, 22 thermally, magnetically or electrically by known techniques. The first technique is to make contact the superconducting rings with a power source. For example, a pair of lead wires (not shown) connected to a power source are made contact with the superconducting ring 21 or 22 at two points, preferably diametrically opposite sides thereof at a temperature where the superconductivity is realized, so that electric current is supplied to the superconducting ring 21 or 22 from the power source. The second technique is to use a suitable magnetic field generator which can create a strong magnetic field passing through the superconducting rings 21, 22 locally so as to create an induced magnetic field passing through the rings 21, 22, which will generate an induced permanent current in the rings 21, 22.

Removal of the permanent current from the superconducting rings 21, 22 can be realized by any one of thermal mode, magnetic mode or current mode. In the cases of the thermal mode and the current mode, respective permanent current can be removed independently from each of the superconducting rings 21 and 22 by applying a predetermined amount of heat or current which exceed the critical temperature or the critical current density of superconductivity to a selected superconducting ring 21 or 22, for example by means of the lead lines above-mentioned. In the case of magnetic mode, it is difficult to remove the permanent current independently from a selected one or more than one superconducting rings. In other words, all permanent currents can be remove simultaneously from all of the superconducting rings.

The read out circuit of the MOSFET itself is well-known and hence is not described here.

What is claimed is:

1. A nonvolatile memory element or cell comprising a memory means consisting of at least one ring formed of a superconductor material so that when the ring is put in a superconducting state, the ring can circulate a permanent electric current therethrough and a detector means consisting of a MOSFET formed in a substrate, said MOSFET including a source region and a drain region formed in a principal surface region of said substrate separated from each other along a principal surface of said substrate, and a channel zone formed between said source region and said drain region, the ring being arranged above and adjacent to said channel zone of said MOSFET in such a manner that a magnetic flux created by current in said ring penetrates and passes through said channel zone of said MOSFET so as to modify a conduction state of said channel zone and wherein said ring is in a plane which is parallel to said principal surface of said substrate and said magnetic flux passes through said channel zone perpendicular to said principal surface of said substrate.

2. A nonvolatile memory element or cell set forth in claim 1, characterized in that one superconducting ring is positioned above the MOSFET and separated therefrom by an insulator.

3. A nonvolatile memory element or cell set forth in claim 1, characterized in that more than one superconducting ring 15 is stacked with respective insulating layers separating them.

4. A nonvolatile memory element or cell set forth in claim 1, characterized in that said at least one ring is composed of superconducting metal or metal alloy.

5. A nonvolatile memory element or cell set forth in claim 1, characterized in that said at least one ring is composed of a compound oxide or a metal oxide complex.

6. A nonvolatile memory element or cell set forth in claim 5, characterized in that said compound oxide is selected from the group consisting of a YBCO type compound oxide superconductor material, a Bi-Sr-Ca-Cu-O system compound oxide superconductor material and a Tl-Ba-Ca-Cu-O system compound oxide superconductor material.

7. A nonvolatile memory element or cell set forth in claim 1 wherein said ring is arranged above and adjacent to said channel zone of said MOSFET with free flux passage between said ring and said channel zone of said MOSFET.

8. A nonvolatile memory element or cell comprising a memory means including at least one ring formed of a superconductor material so that when the ring is put in a superconducting state, the ring can circulate a permanent electric current therethrough and a detector means including a MOSFET formed in a substrate, said MOSFET including a source region and a drain region formed in a principal surface region of said substrate separated from each other along a principal surface of said substrate, and a channel zone formed between said source region and said drain region, the ring being arranged outside of and adjacent to said channel zone of said MOSFET in such a manner that a magnetic flux created by current in said ring penetrates and passes through said channel zone of said MOSFET so as to modify a conduction state of said channel zone and wherein said ring is in a plane which is parallel to said principal surface of said substrate and said magnetic flux passes through said channel zone perpendicular to said principal surface of said substrate.

9. A nonvolatile memory element or cell set forth in claim 7 wherein said ring is arranged above and adjacent to said channel zone of said MOSFET with free flux passage between said ring and said channel zone of said MOSFET.

10. A nonvolatile memory element or cell set forth in claim 8 wherein said MOSFET includes a source electrode in electrical contact with said source, a drain electrode in electrical contact with said drain, and a gate electrode electrically isolated from said memory means and adjacent said channel zone such that voltage applied to said gate electrode affects conductivity in said channel zone.

11. A nonvolatile memory element or cell set forth in claim 10 wherein said gate electrode is at least partially between an interior zone within said at least one ring and said channel zone.

12. A nonvolatile memory element or cell set forth in claim 8 wherein said magnetic flux modifies the conduction state of said channel zone by separating the conduction band and the valence band of semiconductor material within said MOSFET into different levels with predetermined energy levels.

13. A nonvolatile memory element or cell comprising a memory means including at least one ring formed of a superconducting material so that when the ring is put in a superconducting state, the ring can circulate a permanent electric current therethrough and a detector means including a MOSFET formed in a substrate, said MOSFET including a source region and a drain region formed in a principal surface region of said substrate separated from each other along a principal surface of said substrate, and a channel zone formed between said source region and said drain region, the ring being arranged outside of and adjacent to said channel zone of said MOSFET in such a manner that a magnetic flux created by current in said ring penetrates and passes through said channel zone of said MOSFET so as to modify a conduction state of said channel zone such that current in said channel zone is dependent on current in said ring, and wherein there are two rings of superconductor material extending in parallel planes and separated by an insulator, and wherein both of said parallel planes are parallel to said principal surface of said substrate and said magnetic flux passes through said channel zone perpendicular to said principal surface of said substrate.

14. A nonvolatile memory element or cell set forth in claim 13 wherein said ring is arranged above and adjacent to said channel zone of said MOSFET with free flux passage between said ring and said channel zone of said MOSFET.

* * * * *

UNITED STATES PATENT AND TRADEMARK OFFICE
CERTIFICATE OF CORRECTION

PATENT NO. : 5,332,722
DATED : July 26, 1994
INVENTOR(S) : FUJIHIRA

It is certified that error appears in the above-identified patent and that said Letters Patent is hereby corrected as shown below:

On title page, item [75] Inventor, should be changed from "Mitsuka" to -- Mitsuaki --;

Claim 9, line 2, (column 9, line 51), change "7" to -- 8 --.

Signed and Sealed this

Eighth Day of November, 1994

Attest:

BRUCE LEHMAN

Attesting Officer     Commissioner of Patents and Trademarks